US008552810B2

(12) United States Patent
Yu

(10) Patent No.: US 8,552,810 B2
(45) Date of Patent: Oct. 8, 2013

(54) ARRANGEMENT FOR REDUCING INTERFERENCE

(75) Inventor: Daekyu Yu, Seoul (KR)

(73) Assignee: WIPAM, Inc., Gyeonggi-do (KR)

( * ) Notice: Subject to any disclaimer, the term of this patent is extended or adjusted under 35 U.S.C. 154(b) by 302 days.

(21) Appl. No.: 12/656,915

(22) Filed: Feb. 19, 2010

(65) Prior Publication Data

US 2010/0148863 A1    Jun. 17, 2010

Related U.S. Application Data

(63) Continuation of application No. PCT/KR2008/004886, filed on Aug. 21, 2008.

(30) Foreign Application Priority Data

Aug. 22, 2007    (KR) .................. 10-2007-0084526

(51) Int. Cl.
*H04B 3/38* (2006.01)
*H01P 5/00* (2006.01)
*H01B 7/00* (2006.01)

(52) U.S. Cl.
USPC ............................................... 333/12; 333/1

(58) Field of Classification Search
USPC .................. 333/12, 156, 177, 5, 1, 109–116; 361/818
See application file for complete search history.

(56) References Cited

U.S. PATENT DOCUMENTS

| 5,359,315 | A | * | 10/1994 | Inoue et al. .................... 336/200 |
| 5,608,364 | A | * | 3/1997 | Hirai et al. ..................... 333/204 |
| 5,929,722 | A | * | 7/1999 | Kono ............................. 333/177 |
| 6,040,524 | A | * | 3/2000 | Kobayashi et al. ............. 174/36 |
| 6,452,249 | B1 | | 9/2002 | Maeda et al. |
| 6,611,041 | B2 | | 8/2003 | Maeda et al. |
| 7,031,689 | B2 | * | 4/2006 | Frank ............................. 455/333 |
| 7,154,354 | B2 | * | 12/2006 | Akram et al. ...................... 333/1 |
| 7,239,851 | B2 | * | 7/2007 | Kosemura et al. .............. 455/78 |
| 7,352,257 | B2 | * | 4/2008 | Sato et al. ......................... 333/1 |
| 7,609,125 | B2 | * | 10/2009 | van Quach et al. ............... 333/5 |
| 7,659,791 | B2 | * | 2/2010 | Park et al. ......................... 333/1 |
| 7,705,690 | B2 | * | 4/2010 | Lee et al. .......................... 333/1 |
| 2004/0222915 | A1 | | 11/2004 | Oki |

FOREIGN PATENT DOCUMENTS

| JP | 2001-308273 | 11/2001 |
| JP | 2004-335876 | 11/2004 |
| JP | 2006310540 | 11/2006 |
| KR | 10-2000-0002030 | 1/2000 |
| KR | 10-2000-0008593 | 2/2000 |
| KR | 10-2007-0082445 | 8/2007 |

OTHER PUBLICATIONS

Yue, C.P. On-Chip Spiral Inductors with Patterned Ground Shield for Si-Based RF IC's, IEEE, Journal of Solid-State Circuits, May 1998, vol. 33, No. 5, pp. 743-752.

(Continued)

*Primary Examiner* — Dean O Takaoka
*Assistant Examiner* — Alan Wong
(74) *Attorney, Agent, or Firm* — Bacon & Thomas, PLLC

(57) ABSTRACT

An arrangement for reducing interference between circuit blocks having differences in the amount of input power and phase differences includes isolation wires located between the circuit blocks and connected to a ground.

2 Claims, 3 Drawing Sheets

(56) References Cited

OTHER PUBLICATIONS

C. Patrick Yue et al., "On-Chip Spiral Inductors with Patterned Ground Shields for Si-Based RFIC's", 1997 Symposium on VLSI Circuits Digest of Technical Papers.

C. Patrick Yue et al., "Design Strategy of On-Chip Inductors for Highly Integrated RF Systems", 1999 ACM.

C. S. Kim et al., "The Present and Future of RF CMOS Technology", EP&C Technical Report, Jan. 2003.

Korean Notice of Allowance dated Dec. 30, 2011 and an English translation thereof.

Chinese Office Action dated Feb. 22, 2012 and an English translation thereof.

* cited by examiner

ARRANGEMENT FOR REDUCING INTERFERENCE

This application is a Continuation Application of PCT International Application No. PCT/KR2008/004886 filed on Aug. 21, 2008, which designated the United States.

FIELD OF THE INVENTION

The present invention generally relates to an arrangement for reducing interference between circuit blocks having differences in the amount of input power and phase thereof, by forming isolation wires connected to a ground in spaces between the circuit blocks.

BACKGROUND OF THE INVENTION

In general, when losses of signals through a semiconductor substrate during a CMOS process are large, it is very important how to prevent circuits from distorting by interference of the semiconductor substrate.

Various studies on methods of overcoming interference between circuits during a CMOS process by connecting a wire connected to the AC ground in a ring shape or developing a process such as deep-n-well (DNW) are being actively made.

The most well-known method of preventing interference between circuits is to additionally provide an AC ground such as a P+ guard ring or an N+ guard ring around the circuits.

In a compound semiconductor process, the conductivity of a semiconductor substrate is very low as compared with that of a complementary metal oxide semiconductor (CMOS) process, and devices are physically isolated well from each other as compared with those manufactured by the CMOS process, such that interference between devices is not an important factor as compared with that of a CMOS process based design.

However, in recent, as the integration degrees and operation frequencies of circuits increase even in compound semiconductor processes, the interference between the circuits owing to transmission of signals through two close wires needs to be considered when the circuits are designed.

The characteristics of a circuit having two wires in parallel are clearly different from those of a circuit having two independent wires. In order to express this phenomenon in simulation, various circuit simulators for RF related designs, in particular, simulators analyzing signals through electro-magnetic (EM) analyses analyze how the interference between such wires is caused.

When the interval between wires becomes narrower as the operation frequency of an integrated circuit increases, the electromagnetic interference between micro-strip lines needs to be considered, and if the integrated circuit is designed and laid out without considering the electromagnetic interference, its efficiency may be unexpectedly deteriorated.

In other words, as the integration degree of an integrated circuit, in particular, the number of simple circuit blocks increases and demands for designs of complex asymmetric circuits increase, the interference shortcomings cannot be solved only by isolating the circuit blocks and widening the interval between the circuit blocks.

In particular, in a layout of a circuit having an asymmetric amount of power or phase thereof, the deterioration of the circuit owing to interference between wires is considerably problematic in a compound semiconductor process.

SUMMARY OF THE INVENTION

It is, therefore, an object of the present invention to provide an arrangement for reducing interference between wires or circuit blocks by adding an isolation wire connected to the ground between the wires or the circuit blocks.

In accordance with one aspect of the present invention, there is provided an arrangement for reducing interference including:

a plurality of circuit blocks having difference between applied powers or phases of the power; and isolation wires located between the circuit blocks and connected to a ground.

In accordance with another aspect of the present invention, there is provided an arrangement for reducing interference including:

a parallel amplifying apparatus in which an input end of a first amplifier is close to an output end of a second amplifier:

an isolation wire located between the first and the second amplifiers and connected to a ground plane or a ground line to isolate the input end of the first amplifier and the output end of the second amplifier from each other.

In accordance with further another aspect of the present invention, there is provided an arrangement for reducing interference including:

at least one circuit block;

an isolation block located in the vicinity of the isolation block to be isolated from the circuit block; and an isolation wire located between the isolation block and the circuit block and connected to a ground.

Therefore, the interference between the circuit blocks can be reduced by locating the isolation wire connected to the ground in a space between the circuit blocks and blocks having inductors so as to isolate the circuit blocks from the blocks having the inductors.

Furthermore, interference between circuit blocks can be reduced by locating the isolation wire connected to a ground between asymmetric circuit blocks having power differences or phase differences.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, exemplary embodiments of the present invention will be described in detail with reference to the accompanying drawings. Detailed descriptions of well-known functions and structures incorporated herein may be omitted to avoid obscuring the subject matter of the present invention.

Figure 1:
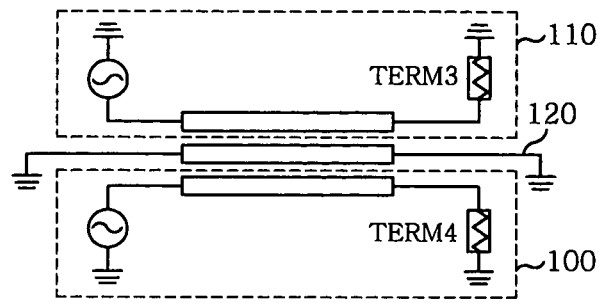
FIG. 1 shows an exemplary arrangement for preventing interferences illustrating a principle of the present invention.

FIG. 1 shows an arrangement for preventing interferences illustrating a principle of the present invention. The arrangement includes two wires 100 and 110, and an isolation wire 120 disposed between the two wires 100 and 110 and connected to a ground. In this connection, the two wires 100 and 110 represent parts of two circuit blocks that are to be isolated from each other. Further, the ground may be the alternating current (AC) ground, a radio frequency (RF) ground, or the direct current (DC) ground. In other words, although a DC voltage is not 0 V, when an AC voltage or an RF voltage is 0 V, the AC ground or the RF ground may be the ground plane or the ground line.

Differences in the arrangement with the isolation wire shown in FIG. 1 and comparative arrangements without isolation wire shown in FIGS. 2 and 3 will be described through simulation.

Figure 2:
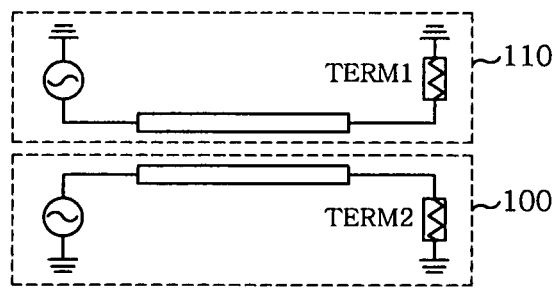
FIGS. 2 and 3 are views illustrating a comparative arrangement having no isolation wire and a comparative arrangement having an independent wire.
Figure 3:
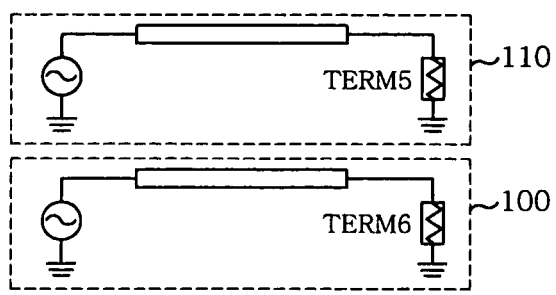

Although the two wires 100 and 110 are arranged in parallel in FIGS. 1, 2, and 3, in an actual arrangement, the two wires 100 and 110 are not arranged simply in parallel, but arbitrarily separated at any location of the wires by calculating impedance through the voltage and current to input ends of the two wires and by calculating impedance at an output end of the two wires.

Assuming that the impedance of input ends of the two wires 100 and 110 is defined by arbitrary impedance in such a way that powers to the input ends shown in FIG. 3 are transmitted to output ends thereof with low loss and terminal impedance is defined by impedance having a sum of the impedances of the lines and the terminal impedance and complex-conjugate-matched impedance, the power of the input end may be transmitted to the output end with little reflection loss.

First, it is assumed that the two wires 100 and 110 have phase differences as in FIG. 2, and the two wires 100 and 110 are independently disposed as in FIG. 3.

Under such assumptions, according to the difference of powers applied to input ends of the wires 100 and 110 or the phase differences of the powers, a ratio of the powers transmitted to the output end becomes different. Following is a description how the power of the output end occurs in each above case.

Before discussing, characteristic impedance of the wires 100 and 110 in FIGS. 1, 2 and 3 is 56.4 Ω, the distance between the two wires 100 and 110 in FIGS. 1 and 2 is 32 μm, the interval between the two wires 100 and 110 in FIG. 3 is large such that there is no interference between the two wires 100 and 110. On the other hand, it is assumed in FIGS. 1, 2 and 3 that impedance of the input ends is 2 Ω, and impedance of the output end ranges from 2.492-j5.055 Ω at 2.5 GHz. Under the foregoing assumptions, a simulation result of input powers applied to the respective wires 100 and 110 and phase difference thereof, is expressed in Table 1.

TABLE 1

| No | Input signal 1 (Power/ Phase) | Input signal 2 (Power/ Phase) | Voltage Magnitude | | Voltage Magnitude | |
|---|---|---|---|---|---|---|
| | | | Term1 Term5 | Term3 Term5 | Term2 Term6 | Term4 Term6 |
| 1 | 0 dBm/0° | 0 dBm/0° | 0.949 | 0.955 | 0.949 | 0.955 |
| 2 | 0 dBm/0° | 0 dBm/90° | 1.199 | 1.077 | 0.605 | 0.800 |
| 3 | 0 dBm/0° | −10 dBm/0° | 0.906 | 0.941 | 1.300 | 1.054 |
| 4 | 0 dBm/0° | −10 dBm/90° | 0.996 | 0.982 | 0.037 | 0.501 |

In Table 1, terms "Term1" and "Term2" denote terminal ends for an input signal 1 and an input signal 2 of the two wires 100 and 110 illustrated in FIG. 2, respectively; "Term3" and "Term4" denote terminal ends for an input signal and an input signal 2 of the two wires 100 and 110 isolated from each other by an isolation wire 120 as shown in FIG. 1, respectively; and "Term5" and "Term6" denote terminal ends for an input signal 1 and an input signal 2 of the independently disposed two wires 100 and 110 as shown 3, respectively.

In general, desired output signal is ones of the Term5 and Term6. When the voltage magnitude approaches a value of 1 and the phase difference approaches the phase difference of the input signal, it is observed that little interference occurs between signals.

In Table 1, it can be seen that when the amounts of powers applied to the two wires 100 and 110 are identical with each other and there is no phase difference, existence of the isolation wire 120 between the two wires 100 and 110 hardly affects output voltage. On the contrary, it can be seen that when the amounts of powers applied to the two wires 100 and 110 differ from each other, and, in addition, there exists a phase difference of the powers, there is a large output voltage difference as compared with the case where the two wires 100 and 110 are independently disposed. Accordingly, it is noted that the use of the isolation wire 120 connected to a ground, may efficiently minimize interference between the two wires 100 and 110 when the interference is significantly large, for example, when there is a difference in powers or a phase difference of the powers.

Embodiments of the present invention to which the principle as mentioned above will be described with reference to FIGS. 4, 5 and 6.

Figure 6:
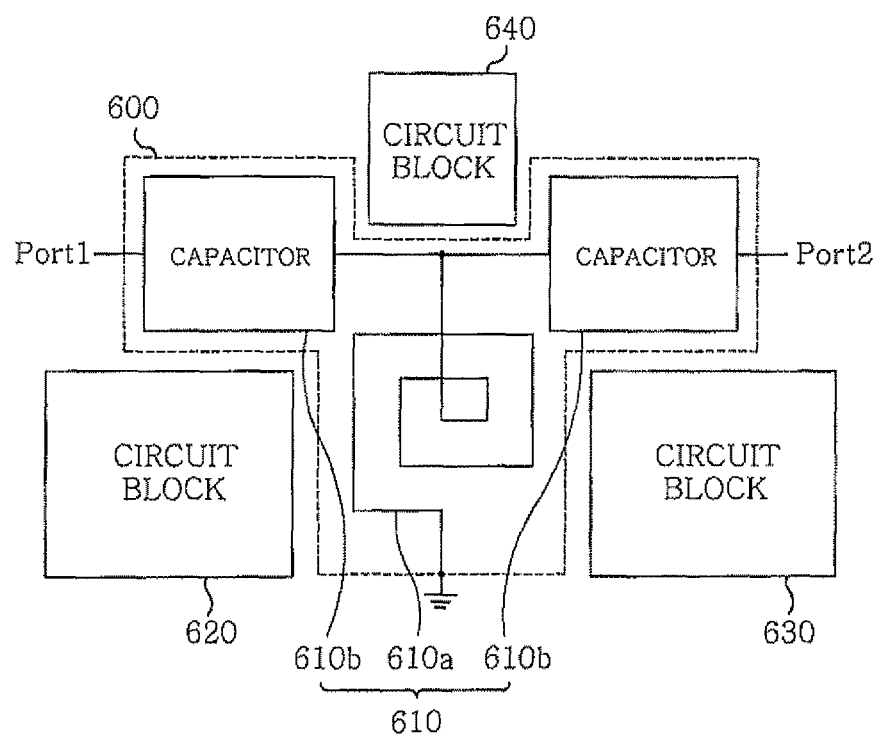
FIG. 6 illustrates an arrangement having an inductor for reducing interference in accordance with a third embodiment of the present invention.

FIG. 6 illustrates an arrangement of a parallel amplifying apparatus for reducing interference in accordance with a first embodiment of the present invention.

Figure 4:
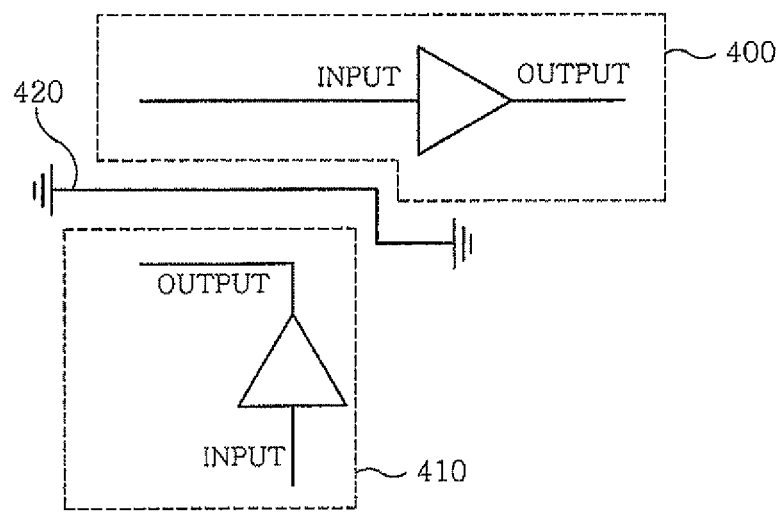
FIG. 4 shows an arrangement of a parallel amplifying apparatus for reducing interference in accordance with a first embodiment of the present invention.

As shown in FIG. 4, the parallel amplifying apparatus includes a first amplifier 400 and a second amplifier 410. An input end of the first amplifier 400 is close an output end of the second amplifier 410, and a phase and power amount between an input wire of the first amplifier 400 and an output wire of the second amplifier 410 are different. In this arrangement, the output of the second amplifier 410 may cause interference in the input end of the first amplifier 400 to distort characteristics in the input end of the first amplifier 400, thereby degrading the entire amplifying apparatus. In order to solve this shortcoming, an isolation wire 420, which is connected with a ground, is arranged between the input wire of the first amplifier 400 and the output wire of the second amplifier 410. As such, the isolation wire 420 between an input wire of the first amplifier 400 and an output wire of the second amplifier 410 prevents an output of the second amplifier 410 from causing interference in the input end of the first amplifier 400.

Figure 5:
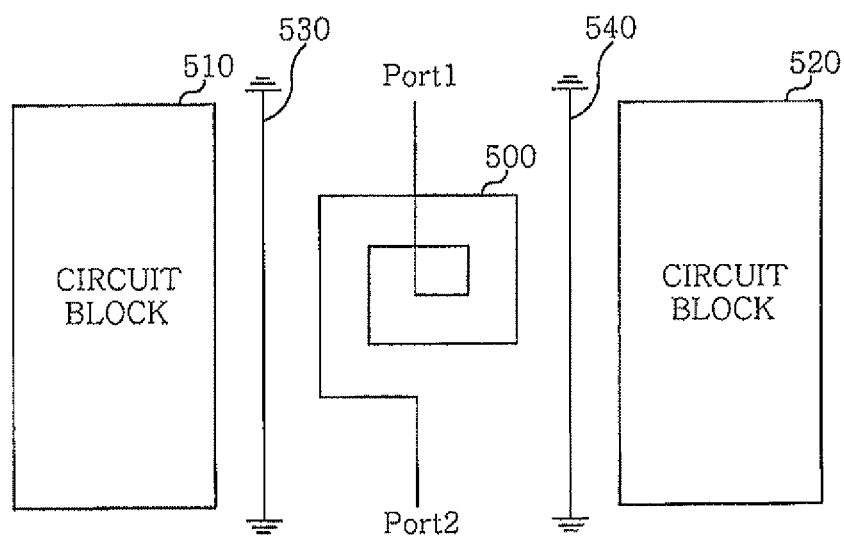
FIG. 5 illustrates an arrangement having an inductor for reducing interference in accordance with a second embodiment of the present invention.

FIG. 5 shows an arrangement having an inductor in accordance with a second embodiment of the present invention.

The arrangement includes a spiral inductor 500 and circuit blocks 510 and 520 disposed with the inductors 500 therebetween. In this arrangement, the spiral inductor 500 may interfere with the circuit blocks 510 and 520. In order to reduce the interference, the arrangement further includes isolation wires 530 and 540 disposed between the inductor 500 and the circuit blocks 510; and the inductor 500 and the circuit block 520, respectively, to isolate the inductor 500 and the circuit blocks 510 and 520. In drawing, reference numerals port1 and port2 represent input and output ends of the inductor 500, respectively.

Although it have been described that the arrangement shown in FIG. 6 has the spiral inductor 500, it is appreciated to skilled person in the art that an equivalent circuit having the same inductance components as the spiral inductor 500 may be also employed.

FIG. 8 shows an arrangement having an isolation block of third embodiment of the present invention.

The arrangement includes a plurality of circuit blocks 620, 630 and 640, and an isolation block 610 having a spiral inductor 610a to be isolated from the circuit blocks 620, 630 and 640. Such an isolation block 610 may include a plurality of components such as capacitors 610b, resistors (not shown), and micro strip lines (not shown), besides the spiral inductor 610a. In addition, the capacitors 610b may include an MIM (metal/insulator/metal) capacitor.

In this arrangement, the isolation block 610 having the spiral inductor 610a may interfere with the circuit blocks 620, 630 and 640. In order to avoid the interference, the arrangement further includes a close loop type isolation wire 600, which is connected with a ground and encloses an entire of the isolation block 610 to isolate it from the circuit blocks 620, 630 and 640. In drawing, reference numerals port1 and port2 represent input and output ends of the isolation block 610, respectively.

In the third embodiment of the present invention, it has been described that the isolation block 610 is isolated from the circuit blocks 620, 630, and 640 using a closed loop type isolation wire. However, another shape of the isolation wire capable of isolating only a necessary part to be isolated, for example, an isolation wire of an open loop type may employed to isolate a part of the isolation block 610 from the circuit blocks 620, 630 and 640.

Although in the third embodiment of the present invention, it has been described that the spiral inductor 610a is provided in the isolation block 610, an equivalent circuit block having the same inductance components as the inductor 610a is equally applicable thereto.

As described earlier, since the isolation block 610 is isolated from the circuit blocks 620, 630, and 640 using the isolation wire 600 of closed loop or open loop, interference between the isolation block 610 and the circuit blocks 620, 630, and 640 may be efficiently reduced.

While the invention has been shown and described with respect to the exemplary embodiments, it will be understood by those skilled in the art that the system and the method are only examples of the present invention and various changes and modifications may be made without departing from the scope of the invention as defined in the following claims.

What is claimed is:

1. An arrangement for reducing interference comprising:
   a parallel amplifying apparatus in which an input end of a first amplifier is close to an output end of a second amplifier;
   an isolation wire located between the first and the second amplifiers and connected to a ground to isolate the input end of the first amplifier and the output end of the second amplifier from each other, such that an output end of the second amplifier is prevented from causing interference in the input end of the first amplifier, and
   wherein a phase and a magnitude of an input signal of the first amplifier are different from those of an output signal of the second amplifier.

2. The arrangement of claim 1, wherein the ground is the AC ground or the DC ground.

* * * * *